United States Patent [19]

Balland

[11] Patent Number: 5,548,472
[45] Date of Patent: Aug. 20, 1996

[54] HIGH ENERGY IGNITION GENERATOR, IN PARTICULAR FOR A GAS TURBINE

[75] Inventor: Patrick Balland, Rueil Malmaison, France

[73] Assignee: Eyquem, Nanterre, France

[21] Appl. No.: 299,077

[22] Filed: Sep. 1, 1994

[30] Foreign Application Priority Data

Sep. 28, 1993 [FR] France .................................. 93 11520

[51] Int. Cl.⁶ ............................... F23Q 3/00; H01T 15/00
[52] U.S. Cl. ............................ 361/253; 361/256; 361/257
[58] Field of Search ................................... 361/253, 256, 361/257, 263; 307/110; 315/209 CD; 123/596, 605; 60/39.06, 39.827

[56] References Cited

U.S. PATENT DOCUMENTS 4,027,198  5/1977  Linkroum .......................... 315/209 CD
5,347,422  9/1994  Smith et al. ............................. 361/253

FOREIGN PATENT DOCUMENTS 2381406  9/1978  France .
2636678  12/1990  France .

OTHER PUBLICATIONS

Figure 1:
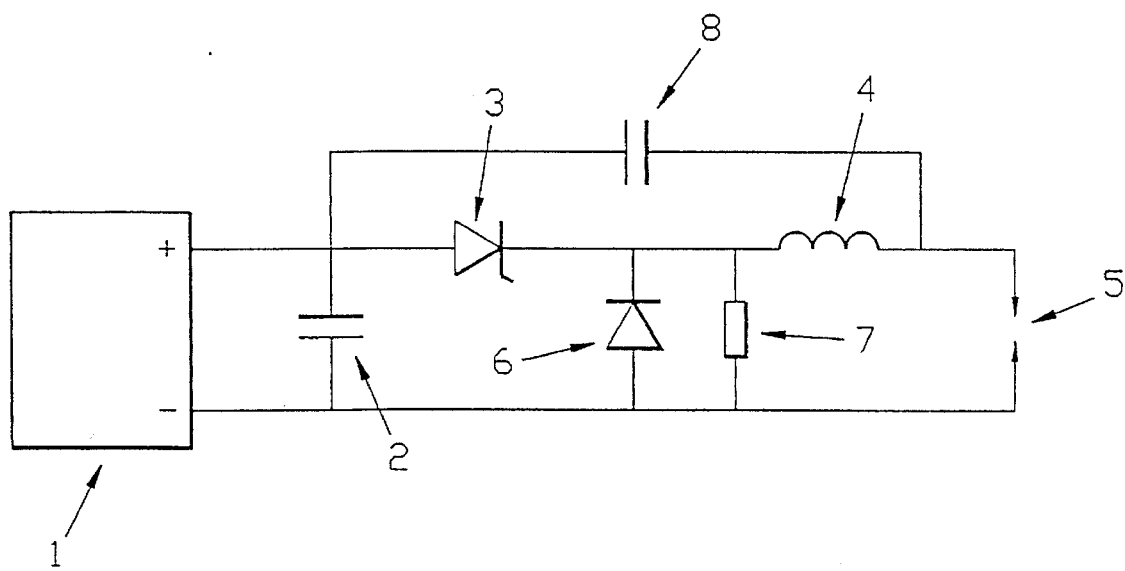

Instruments and Experimental Techniques., vol. 22, No. 4, 2, Jul. 1979, New York, US, pp. 1060–1062, Abryamyan et al., "Correction Of The Pulse Shape Of An ARKAD'EV–MARX Voltage Generator", p. 1060–p. 1061, Figure 1.

Primary Examiner—Fritz M. Fleming
Attorney, Agent, or Firm—Wenderoth, Lind & Ponack

[57] ABSTRACT

A source of energy (1) is connected to an energy storage circuit including a first storage capacitor (2) and a connecting element (3) for connecting the storage circuit to a discharging circuit. The discharging circuit includes in series a energy recovering inductance (4) and an ignition spark plug (5), and to terminals of which the discharging circuit there are connected free wheel diode (6) and a resistor (7) connected in parallel, so as to generate sparks between the electrodes of the spark plug. The energy storage circuit also includes a second capacitor (8) connected in parallel to terminals of the connecting element (3) and inductance element (4).

12 Claims, 2 Drawing Sheets

HIGH ENERGY IGNITION GENERATOR, IN PARTICULAR FOR A GAS TURBINE

The present invention relates to a high energy ignition generator, in particular for a gas turbine.

A number of ignition generators of this type are known in the art which comprise a source of energy connected to an energy storage means charging circuit comprising a storage capacitor and means for connecting said storage means to a discharging circuit comprising in series energy recovering inductance means and an ignition spark plug and to the terminals of which discharging circuit there are connected free wheel means and a resistor in parallel so as to generate sparks between the electrodes of the ignition spark plug.

Various means for connecting the energy storage means to the discharging circuit are also known in the art.

Thus for example these connecting means may be constituted by a gas ignition gap or by semiconductor switching means such as for example thyristors.

Replacing the gas ignition gaps by such semiconductor switching means has permitted improving the overall operation of these generators and especially their reliability.

However, the integration of these means in such an environment creates a number of problems owing to the operational stresses that this type of equipment must support.

It is known for example from the document FR-A-2 636 678 in the name of LABO INDUSTRIE that operational temperature stresses have led to the provision of special charging means for the energy storage means for the purpose of ensuring that the leakage currents of these semiconductor switching means do not result in the destruction of the switching means by self-heating.

Further, the operational characteristics of the generator are related to the operational characteristics of the means for connecting the energy storage means to the rest of the circuits of this generator, and it will be understood that the limiting operational characteristics of these circuits determine the overall operation of the generator.

Indeed, these connecting means are connected between the energy storage means and the rest of the circuits of the generator and may be constituted by one or more semiconductor switching means, so that one is obliged either to limit the output characteristics of the generator so as to adapt them to the operational characteristics of the semiconductor switching means, or to combine a large number of semiconductor switching means so as to constitute connecting means adapted to the desired output characteristics of the generator.

It will be understood that each of these solutions presents drawbacks.

An object of the invention is therefore to overcome these problems by providing an ignition generator which is simple, reliable, has good output characteristics and yet uses only connecting means having conventional operational characteristics.

The invention therefore provides a high energy ignition generator, in particular for a gas turbine, of the type comprising a source of energy connected to an energy storage means charging circuit comprising a first storage capacitor and means for connecting said storage means to a discharging circuit comprising in series energy recovering inductance means and an ignition spark plug, and to terminals of which discharging circuit there are connected free wheel means and a resistor in parallel, so as to generate sparks between the electrodes of the spark plug, characterized in that the energy storage means comprise a second capacitor connected in parallel to terminals of said connecting means and of at least a part of the inductance means.

Figure 2:
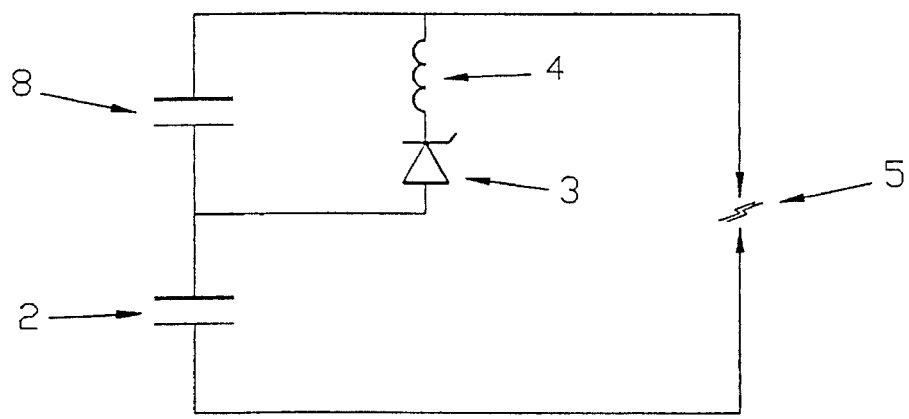
Figure 3:
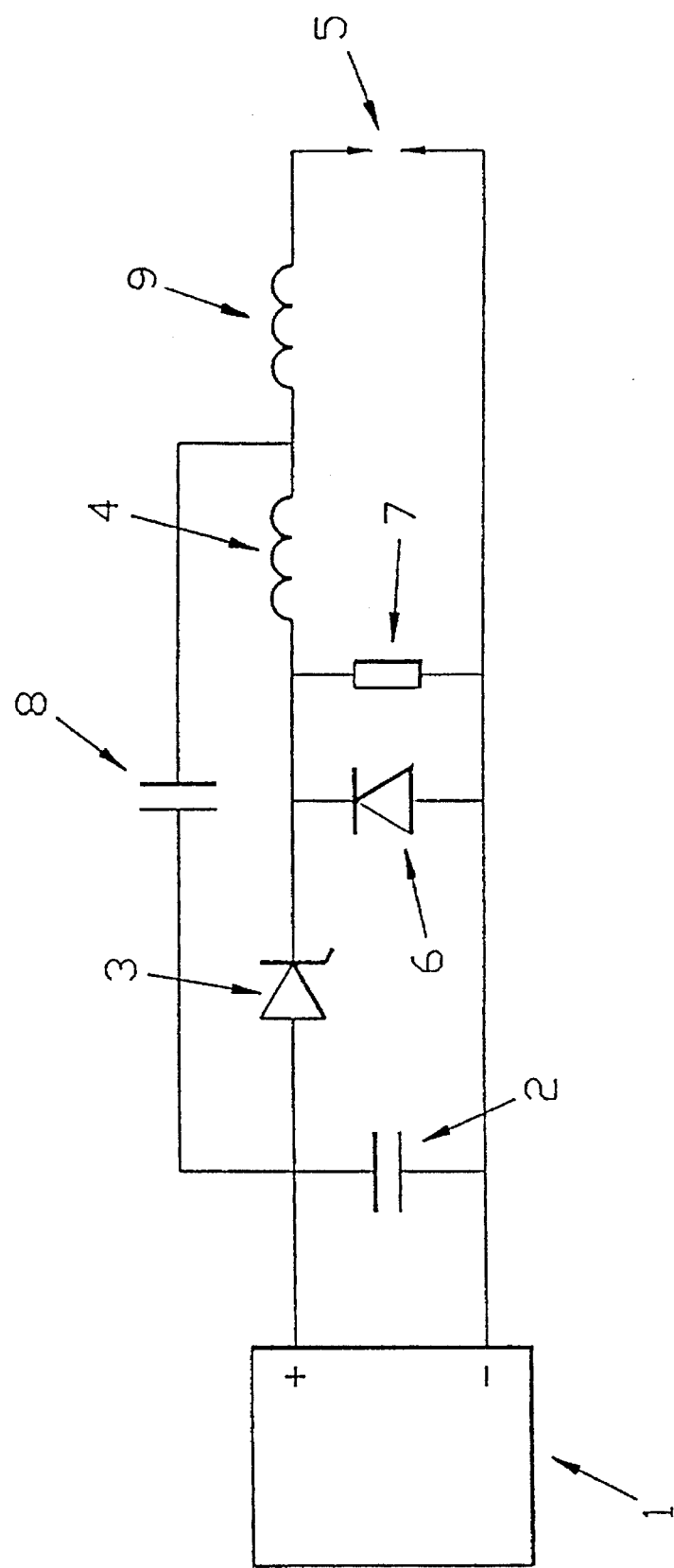

A better understanding of the invention will be had from the following description which is given solely by way of example with reference to the accompanying drawings, in which:

FIG. 1 is a block diagram illustrating the structure of an ignition generator according to the invention, and FIG. 2 is an equivalent electric diagram of the generator shown in FIG. 1 when a spark is produced between the electrodes of the spark plug, and FIG. 3 is a block diagram of a modified structure of an ignition generator which is similar to that of FIG. 1, except that a second inductor has been added.

As can be seen in FIG. 1, a high energy ignition generator, in particular for a gas turbine, according to the invention, comprises in the conventional manner a DC source of energy designated by the general reference numeral 1. This source of energy may have a conventional structure known in the art and will therefore not be described in detail.

However, note that it may be formed by a source of energy associated with special means controlling the charging of the energy storage means, as disclosed in the aforementioned French document.

In the embodiment described with reference to FIG. 1, these energy storage means comprise a first capacitor designated by the general reference numeral 2 connected to the output terminals of the source of energy.

This generator further comprises means 3 for connecting this energy storage capacitor to the rest of the circuits of the generator.

These connecting means may comprise for example a conventional gas ignition gap or one or more semiconductor switching means such as for example thyristors which are actuated for example by means for comparing the voltage at the terminals of the energy storage means with a reference value as disclosed in the aforementioned French document.

The output of these connecting means is connected to a discharging circuit comprising energy recovering inductance means 4 connected in series with an ignition spark plug 5, there being connected in parallel a free wheel diode 6 and a resistor 7 to the terminals of the discharging circuit.

According to the invention, the energy storage means further comprise a second capacitor connected in parallel to terminals of the inductance means 4 and of the connecting means 3.

This second capacitor is designated by the general reference numeral 8 in FIG. 1 and may be a capacitor which is electrically equivalent to the first capacitor 2 of the energy storage means.

This generator operates in the following manner:

1) Charging stage of the energy storage means.

When the source of energy is brought into action, the two capacitors 2 and 8 of the energy storage means are charged at the same output voltage of the source. The first capacitor 2 is connected directly between the output terminals of the source of energy and the second capacitor 8 is connected to these output terminals of the source of energy through the diode 6 and the resistor 7 in parallel and the inductance means 4. No spark is produced between the electrodes of the spark plug 5 and the connecting means 3 are not actuated.

2) Actuation of the connecting means.

Actuation of the connecting means 3 permits connecting the second capacitor 8 to the inductance means 4 so as to form a parallel LC circuit so that a voltage inverse to that across the terminals of the second capacitor 8 appears at the terminals of these inductance means.

The first and second capacitors 2 and 8 having been charged at the same voltage, it will be understood that the voltage between the electrodes of the spark plug is then zero, since the voltage across the terminals of the inductance means 4 is of opposite sign to that of the voltage across the terminals of the first capacitor 2.

However, owing to the actuation of the connecting means 3, the second capacitor 8 and the inductance means 4 constituting a parallel LC circuit, as the second capacitor discharges into the inductance means, the tension across the terminals of the latter decreases so that the tension across the electrodes of the spark plug increases up to the charging voltage of the first capacitor. The voltage across the terminals of the inductance means 4 passes through 0 and then increases in changing sign. In theory, this voltage across the terminals of the inductance means 4 could, ignoring voltage drops in the circuit, increase up to a magnitude equal to the magnitude of the charging voltage of the second capacitor.

It will therefore be understood that, after the passage through zero of the voltage across the terminals of the inductance means and the inversion of the sign of this voltage, the voltage across the electrodes of the spark plug increases, since the voltage across the terminals of the inductance means is added to that across the terminals of the first capacitor.

3) Production of the spark between the electrodes of the spark plug.

As the voltage across the electrodes of the spark plug gradually increases, it produces a spark therebetween.

The equivalent electric diagram of the generator is then that illustrated in FIG. 2, since the production of a spark between the electrodes of the spark plug causes the closure of the circuit through the first and second capacitors which are then connected in series, the connecting means 3 and the induction means 4 constituting a series circuit connected in parallel to the terminals of the second capacitor 8. In this equivalent diagram, the diode 6 and the resistor 7 have been eliminated in order to render the explanation of the operation more clear.

It can be seen from this equivalent diagram shown in FIG. 2 that the current flowing between the electrodes of the spark plug is the sum of the current flowing in the two circuit branches in parallel, namely in the branch comprising the second capacitor 8 and in the branch comprising the connecting means 3 and the inductor 4.

It will therefore be understood that this structure permits solving the various problems of the generators of the prior art in which the whole of the current flowing between the electrodes of the spark plug passed through the connecting means, which required either limiting this current in accordance with the characteristics of these connecting means, or combining a plurality of semiconductor switching means, for example, so as to obtain connecting means capable of supporting in particular a given current intensity for the purpose of obtaining predetermined output characteristics of the generator.

Further, this particular structure also operates as a voltage doubling means for initiating the sparks by the addition of the voltage across the terminals of the first capacitor 2 and the voltage across the terminals of the induction means 4, this voltage resulting from the operation in a parallel LC circuit of the circuit part constituted by these induction means 4, the second capacitor 8 and the connecting means 3.

This permits limiting the output voltage of the source and therefore the voltage applied to the terminals of the connecting means when the latter are blocked.

It is indeed known that, when these connecting means comprise semiconductor switching means, it is important to reduce the voltage applied to the latter when they are blocked so as to reduce the self-heating thereof by the leakage currents.

It will be observed that it is also possible to provide inductance means comprising two separate elements connected in series as shown in FIG. 3, namely one disposed in the manner of the inductance means 4 shown in FIG. 3 and the other inductance 9 disposed in series with the ignition spark plug 5, the second capacitor 8 then being connected to the midpoint between these two inductance elements 4 and 9.

In this case, the inductance element connected in series with the spark plug serves to control the current flowing in the latter.

What is claimed is:

1. High energy ignition generator, said generator comprising in combination: a source of energy, an energy storage means charging circuit connected to said source of energy and comprising a first storage capacitor and connecting means, a discharging circuit comprising energy recovering inductance means and an ignition spark plug having electrodes connected in series, said connecting means connecting said storage means to said discharging circuit, free wheel means and a resistor connected in parallel to said discharging circuit so as to produce sparks between said electrodes of said spark plug, said energy storage means further comprising a second capacitor connected in parallel to a series connection of said connecting means and said inductance means.

2. A generator according to claim 1, wherein said inductance means comprises a first induction element connected at a connection point to said second capacitor, and wherein said generator further comprises a second induction element connected between said connection point and said ignition spark plug.

3. A generator according to claim 1, wherein said connecting means comprise at least one semiconductor switch.

4. A generator according to claim 1, wherein said first capacitor and said second capacitor are electrically equivalent.

5. A high energy ignition generator, comprising:

a voltage source having first and second output terminals;

a first capacitor having first and second terminals electrically connected to said first and second output terminals of said voltage source, respectively;

an ignition spark plug having first and second electrodes, said second electrode of said ignition spark plug electrically connected to said second terminal of said first capacitor;

a connecting element having first and second terminals, said first terminal of said connecting element electrically connected to said first terminal of said first capacitor;

an inductor having first and second terminals electrically connected to said first electrode of said connecting element and to said first electrode of said ignition spark plug, respectively, wherein said connecting element and said inductor are electrically connected in series between said capacitor and said ignition spark plug;

a parallel circuit having a diode and a resistor electrically connected in parallel to each other between said first terminal of said inductor and said second electrode of said ignition spark plug; and, a second capacitor having first and second terminals electrically connected to said first terminal of said connecting element and to said second terminal of said inductor, wherein said second capacitor is electrically connected in parallel across the series connection of said connecting element and said inductor.

6. A high energy ignition generator as claimed in claim 5, further comprising a second inductor electrically interposed in series between said second terminal of said inductor and said first electrode of said ignition spark plug.

7. A high energy ignition generator as claimed in claim 6, wherein said connecting element is a semiconductor switch.

8. A high energy generator as claimed in claim 7, wherein said first and second capacitors are electrically equivalent.

9. A high energy generator as claimed in claim 6, wherein said first and second capacitors are electrically equivalent.

10. A high energy ignition generator as claimed in claim 5, wherein said connecting element is a semiconductor switch.

11. A high energy generator as claimed in claim 10, wherein said first and second capacitors are electrically equivalent.

12. A high energy generator as claimed in claim 5, wherein said first and second capacitors are electrically equivalent.

* * * * *